(12) United States Patent
Carey et al.

(10) Patent No.: US 8,427,887 B2
(45) Date of Patent: *Apr. 23, 2013

(54) DEVICES, SYSTEMS, AND METHODS FOR A POWER GENERATOR SYSTEM

(75) Inventors: George F. G. Carey, Boise, ID (US); Brian P. Callaway, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/224,070

(22) Filed: Sep. 1, 2011

(65) Prior Publication Data

US 2011/0310679 A1 Dec. 22, 2011

Related U.S. Application Data

(63) Continuation of application No. 12/042,505, filed on Mar. 5, 2008, now Pat. No. 8,014,216.

(51) Int. Cl.
*G11C 11/34* (2006.01)

(52) U.S. Cl.
USPC ............ 365/189.09; 365/189.06; 365/189.07; 365/201; 365/226; 327/535; 327/537; 327/545

(58) Field of Classification Search ............ 365/189.09, 365/226, 227, 229; 322/28, 33, 36, 59
See application file for complete search history.

(56) References Cited

U.S. PATENT DOCUMENTS

| | | | |
|---|---|---|---|
| 5,596,534 A | 1/1997 | Manning | |
| 5,698,972 A | 12/1997 | Keeth | |
| 5,710,740 A | 1/1998 | Manning | |
| 5,841,691 A | 11/1998 | Fink | |
| 6,438,645 B1 | 8/2002 | Casper | |
| 6,496,421 B1 | 12/2002 | Van De Graaff et al. | |
| 6,700,824 B2 | 3/2004 | Van De Graaff et al. | |
| 6,721,211 B2 | 4/2004 | Lee et al. | |
| 6,731,556 B2 | 5/2004 | Derner et al. | |
| 6,781,443 B2 | 8/2004 | Hamamoto et al. | |
| 6,930,503 B2 | 8/2005 | Sher et al. | |
| 7,054,208 B2 | 5/2006 | Beigel et al. | |
| 7,256,643 B2 | 8/2007 | Pan et al. | |
| 2001/0040241 A1* | 11/2001 | Nagano et al. ................. | 257/159 |
| 2003/0197551 A1* | 10/2003 | Hamamoto et al. ........... | 327/540 |
| 2005/0040804 A1* | 2/2005 | Hashimoto et al. ........... | 323/313 |
| 2005/0068015 A1* | 3/2005 | Hazucha et al. ............. | 323/272 |
| 2005/0093529 A1* | 5/2005 | Hur ............................. | 323/313 |
| 2006/0126405 A1 | 6/2006 | Jung | |
| 2007/0159237 A1 | 7/2007 | Zimlich | |

* cited by examiner

*Primary Examiner* — Pho M Luu
*Assistant Examiner* — Thao Bui
(74) *Attorney, Agent, or Firm* — TraskBritt

(57) ABSTRACT

Methods, devices, and systems are provided for a power generator system. The power generator system may include a control device configured to output a first reference voltage and a second reference voltage that define a dead band range. The control device may be configured to independently adjust the first reference voltage and the second reference voltage. The power generator system may also include a power generator operably coupled to the control device, and the power generator may be configured to receive the first reference voltage and the second reference voltage and to output a voltage that is greater than or substantially equal to the first reference voltage and less than or substantially equal to the second reference voltage.

20 Claims, 5 Drawing Sheets

DEVICES, SYSTEMS, AND METHODS FOR A POWER GENERATOR SYSTEM

CROSS-REFERENCE TO RELATED APPLICATION

This application is a continuation of U.S. patent application Ser. No. 12/042,505, filed Mar. 5, 2008, now U.S. Pat. No. 8,014,216 issued on Sep. 6, 2011, the disclosure of which is hereby incorporated herein by this reference in its entirety.

TECHNICAL FIELD

Embodiments of the present invention relate to semiconductor memory devices. More particularly, one or more embodiments of the present invention relate to power generators, to devices and systems utilizing the same, and to methods of operation.

BACKGROUND

Conventional electronic systems may include one or more memory devices such as a dynamic random access memory (DRAM), static random access memory (SRAM), Flash memory, or other conventional memory devices. A memory device stores data in vast arrays of memory cells. Each cell conventionally stores a single bit of data (a logical "1" or a logical "0") and can be accessed or addressed. Data is output from a memory cell during a "data read" operation, and data is stored into a memory cell during a "data write" operation.

FIG. 1 illustrates a portion of a memory device 100, such as a DRAM device. Memory device 100 includes a plurality of dynamic memory cells 112, a plurality of access lines, such as word lines 114 and a plurality of data lines, such as bit lines 116. For convenience purposes, only two memory cells 112, two word lines 114 and two bit lines 116 are illustrated in FIG. 1. Memory cells 112 are organized as an array of columns and rows. Each column typically includes numerous memory cell pairs, such as the single pair illustrated in FIG. 1. Each memory cell 112 comprises a storage cell 120 (e.g., a capacitor) and an access device 122, such as a metal oxide semiconductor field effect transistor (MOSFET).

Two supply voltages are usually required to operate and access a memory cell 112. The first supply voltage is conventionally a reference voltage, such as ground and the second supply voltage is conventionally referred to as Vcc. A first cell plate of the storage cell 120 is connected to a reference voltage Vref_dvc2 having a potential between Vcc and ground. Reference voltage Vref_dvc2 is produced by a power generator 200 (see FIG. 2) and is typically equal to Vcc/2, or the average of the first and second memory cell supply voltages. The first cell plate of each storage cell 120 is typically connected to reference voltage Vref_dvc2. A second cell plate of each storage cell 120 is connected to one active terminal of an access device 122.

One of the bit lines 116 is connected to the other active terminal of the access device 122. The control terminal (e.g., gate) of the access device 122 is connected to one of the word lines 114. Thus, each memory cell 112 is connected to a word line 114 and a bit line 116. The word lines 114 and bit lines 116 form a two-dimensional array having a plurality of intersections. A single memory cell 112 corresponds to each intersection. At an intersection, word line 114 is used to selectively activate the corresponding memory cell 112. Activating the memory cell 112 connects its storage cell 120 to the corresponding bit line 116, which allows conventional memory access operations (e.g., data read, data write, and refresh) to occur.

Memory device 100 may also include an equilibrate circuit 130. The equilibrate circuit 130 may include two MOSFET transistors 132, 134. One active terminal of each transistor 132, 134 is connected to receive reference voltage Vref_dvc2. The other active terminal of each transistor 132, 134 is connected to one of the adjacent bit lines 116. The equilibrate circuit 130 is responsive to an equilibrate signal EQ to simultaneously connect reference voltage Vref_dvc2 to the bit lines 116. During normal memory access operations, the equilibrate signal EQ is activated to set the bit lines 116 to reference voltage Vref_dvc2 prior to activating the corresponding access device 122 and accessing the memory cells 112. Conventionally, the first cell plate of each storage cell 120 is maintained at reference voltage Vref_dvc2. The second cell plate of each storage cell 120 is charged to either the first memory cell supply voltage or the second memory cell supply voltage, depending on whether a "0" or "1" is being written to the storage cell 120. Data is read from the memory cells 112 of memory device 100 by activating a word line 114 (via a row decoder), which couples all of the memory cells 112 corresponding to that word line 114 to respective bit lines 116, which define the columns of the array. When a particular word line 114 is activated, sense amplifier circuitry connected to a bit line 116 detects and amplifies the data bit transferred from the storage cell 120 to its bit line 116 by measuring the potential difference between the activated bit line 116 and a reference bit line which is charged to reference voltage Vref_dvc2.

FIG. 2 illustrates a conventional power generator 200. Power generator 200 includes a first operational amplifier 202, a second operational amplifier 204, and an output reference voltage Vref_dvc2. Input reference voltage Ref_High, having a fixed magnitude, is coupled to a non-inverting input of first operational amplifier 202 and input reference voltage Ref_Low, also having a fixed magnitude, is coupled to an inverting input of second operational amplifier 204. Output reference voltage Vref_dvc2 is fed back into an inverting input of first operational amplifier 202 and a non-inverting input of second operational amplifier 204. With this feedback configuration, as output reference voltage Vref_dvc2 decreases and becomes equal to input reference voltage Ref_Low, first operational amplifier 202 supplies an active pull-up and, therefore, increases the voltage of output reference voltage Vref_dvc2. On the other hand, as output reference voltage Vref_dvc2 increases and becomes equal to input reference voltage Ref_High, second operational amplifier 204 supplies an active pull-down and, therefore, decreases the voltage of output reference voltage Vref_dvc2. As a result, this configuration ensures that output reference voltage Vref_dvc2 does not rise above input reference voltage Ref_High or fall below input reference voltage Ref_Low.

The voltage range wherein first operational amplifier 202 will not supply an active pull-up and second operational amplifier 204 will not supply an active pull-down is commonly referred to as the "dead band" (which is sometimes referred to as "hysteresis") of power generator 200. As such, the dead band is a voltage range between input reference voltages Ref_High and input reference voltages Ref_Low and the magnitude of the dead band is determined by the values of input reference voltages Ref_High and Ref_Low. The dead band for power generators within a conventional memory device is in the range of 5 mV-200 mV.

Since memory data read/data write operations use Vref_dvc2 as a reference voltage, the magnitude and stability of output reference voltage Vref_dvc2 is very important for correct memory operation. During various operational modes, small variations in output reference voltage Vref_dvc2 can dramatically alter the functionality of a memory device. Therefore, it is desirable to have a responsive power generator with a narrow dead band. On the other hand, narrowing the dead band of a power generator for tighter control of output reference voltage Vref_dvc2 increases the frequency of active pull-ups and active pull-downs performed by the power generator. Consequently, this increases the current consumption of the power generator, which is undesirable.

There is a need for methods, devices, and systems to enhance the operation of a power generator at a relatively low power consumption. Specifically, there is a need for a power generator system including a power generator configured to operate at a variable dead band.

DETAILED DESCRIPTION

In the following detailed description, reference is made to the accompanying drawings which form a part hereof and, in which is shown by way of illustration, specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the disclosure.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the various embodiments of the present invention may be practiced by numerous other partitioning solutions. For the most part, details concerning timing considerations, and the like, have been omitted where such details are not necessary to obtain a complete understanding of the present invention in its various embodiments and are within the abilities of persons of ordinary skill in the relevant art.

The term "bus" is used to refer to a plurality of signals or conductors, which may be used to transfer one or more various types of information, such as data, addresses, control, or status. Additionally, a bus or a collection of signals may be referred to in the singular as a signal. Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

Figure 3:
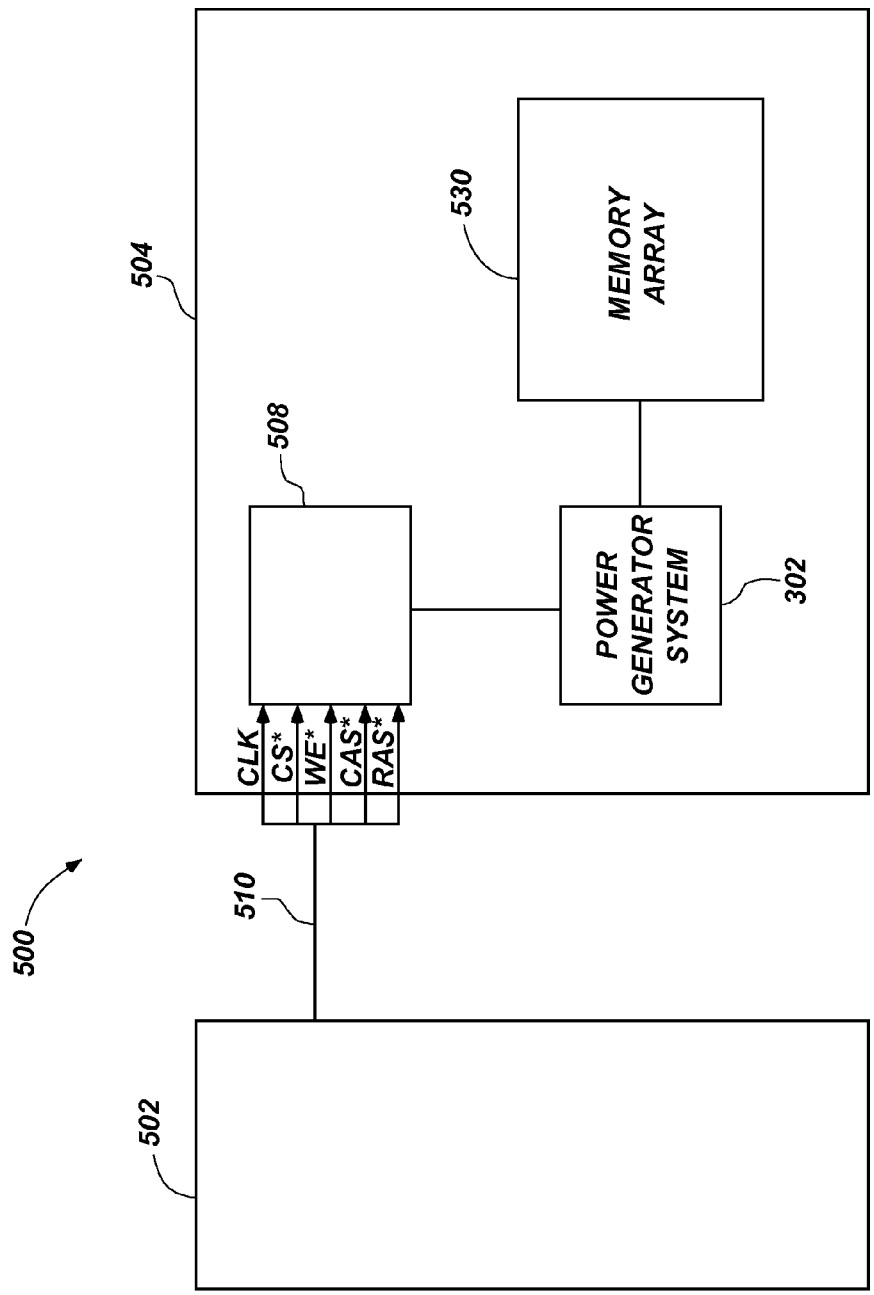
FIG. 3 is a block diagram of a memory device including a power generator system according to an embodiment of the present invention.

Before describing the power generator system and operation thereof with respect to illustrated embodiments in more detail, the various components of an embodiment of a memory device 504 will first be described. FIG. 3 is a block diagram of a memory system 500 including a memory controller 502 operably coupled to a memory device 504 that includes one or more power generator systems 302, in accordance with various embodiments of the present invention. In the following description, certain details are set forth to provide a sufficient understanding of the invention. It will be clear to one of ordinary skill in the art, however, that the invention may be practiced without these particular details. In FIG. 3, well known circuits, device components, control signals, timing protocols, and software operations have not been shown in detail or omitted entirely in order to avoid unnecessarily obscuring the invention.

Memory device 504 may be a Flash memory device, a dynamic random access memory (DRAM) device, or a static random access memory (SRAM) device. Examples of DRAM devices include synchronous DRAM (SDRAM), synchronous graphics random access memory (SGRAM), various generations of double data rate SDRAM (DDR SDRAM), various generations of Graphic Double Data Rate DRAM (GDDR DRAM), and Rambus DRAM devices.

Memory device 504 may include a memory array 530 having a plurality of memory cells (not shown) for storing data. A control circuit 508 controls the operations of memory device 504 in response to control signals on control bus 510. Examples of the operations of memory device 504 include a data read operation and a data write operation.

Figure 4:
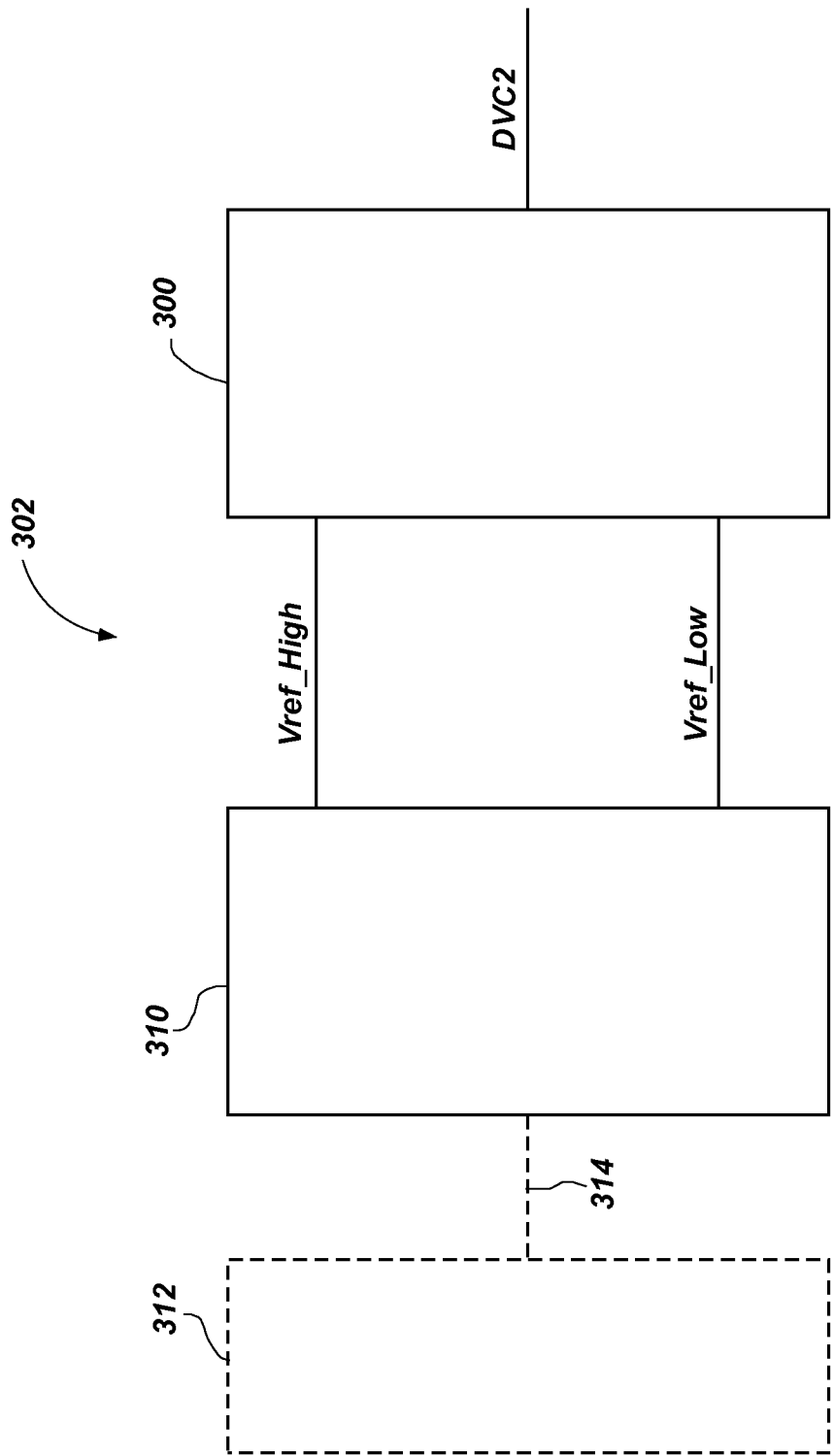
FIG. 4 is a block diagram of a power generator system, in accordance with an embodiment of the present invention.

FIG. 4 illustrates an embodiment of a power generator system 302 including a control device 310 operably coupled to a power generator 300. Furthermore, power generator system 302 may include a control signal generator 312 operably coupled to control device 310. Control device 310 may include control logic configured to receive one or more control signals (which may also be referred to as commands) and, thereafter, depending on the status of the one or more control signal, determine and output at least one reference voltage, such as an upper reference voltage $V_{Ref\_high}$ and a lower reference voltage $V_{Ref\_low}$. For example, upon receipt one of one or more control signals, control device 310 may increase upper reference voltage $V_{Ref\_high}$ and/or increase lower reference voltage $V_{Ref\_low}$, or decrease upper reference voltage $V_{Ref\_high}$ and/or decrease lower reference voltage $V_{Ref\_low}$. Furthermore, upon receipt of one or more control signals, control device 310 may increase upper reference voltage $V_{Ref\_high}$ and decrease lower reference voltage $V_{Ref\_low}$, or decrease upper reference voltage $V_{Ref\_high}$ and increase lower reference voltage $V_{Ref\_low}$. It should be noted that any combination of increasing or decreasing upper reference voltage $V_{Ref\_high}$ and/or increasing or decreasing lower reference voltage $V_{Ref\_low}$ is within the scope of the disclosure. Although control device 310 is illustrated as a single control device, control device 310 may be implemented as a plurality of independently configurable control devices.

Control signal generator 312 may be configured to transmit one or more control signals to control device 310 via bus 314. For example only, and not by way of limitation, control signal generator 312 may comprise one or more state machines, one or more sensors (e.g., temperature sensors or voltage sensors), a mode register, or any combination thereof. As described in more detail below, depending on the status of the one or more control signals received via bus 314, control device 310 may determine and output, to power generator 300, the appropriate magnitudes for upper reference voltage $V_{Ref\_high}$ and/or lower reference voltage $V_{Ref\_low}$. Although control signal generator 312 is illustrated as a single control signal generator, control signal generator 312 may be implemented as a plurality of independently configurable control signal generators.

Figure 1:
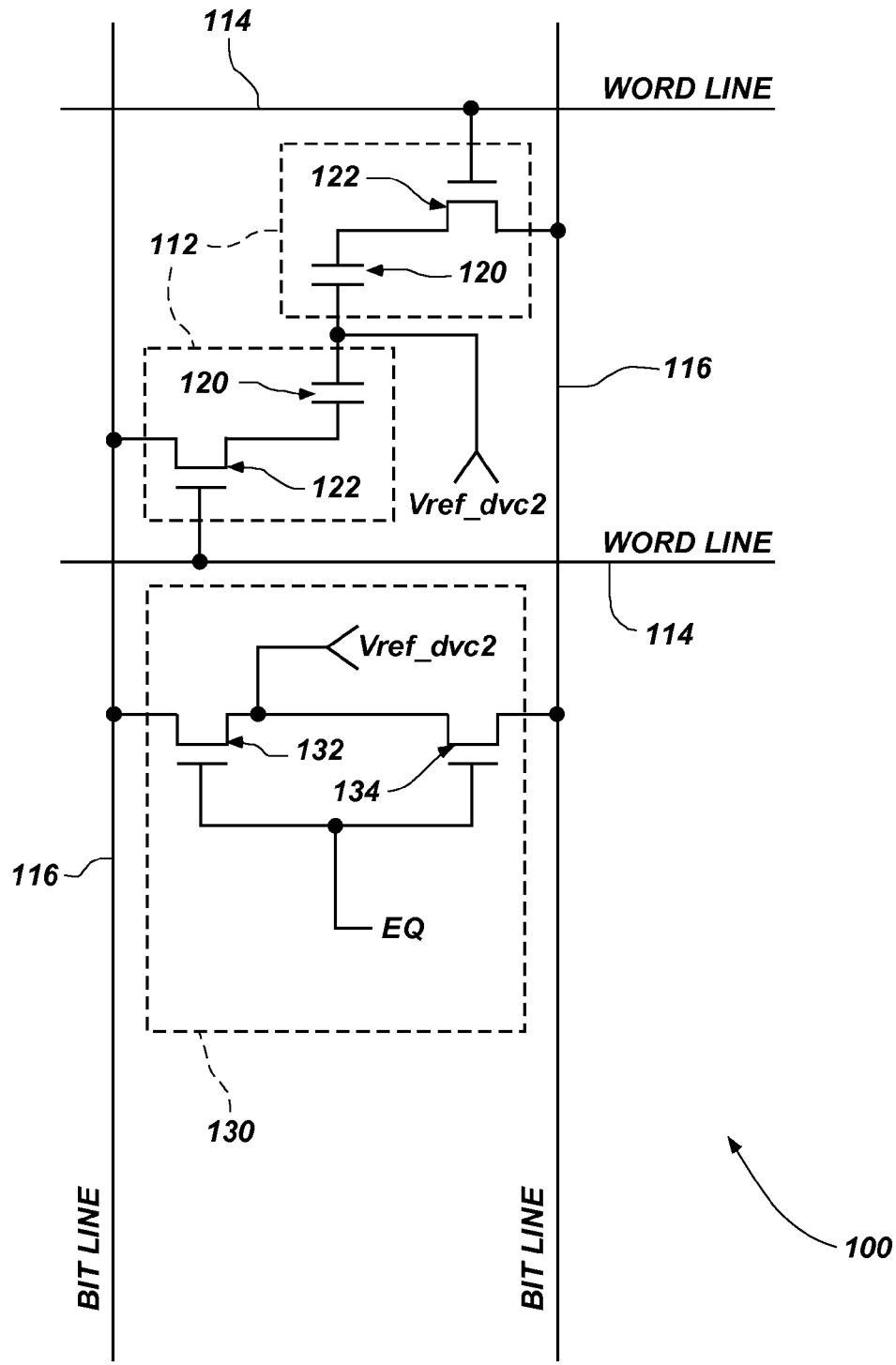
FIG. 1 is a schematic diagram of a portion of a conventional dynamic random access memory device.
Figure 2:
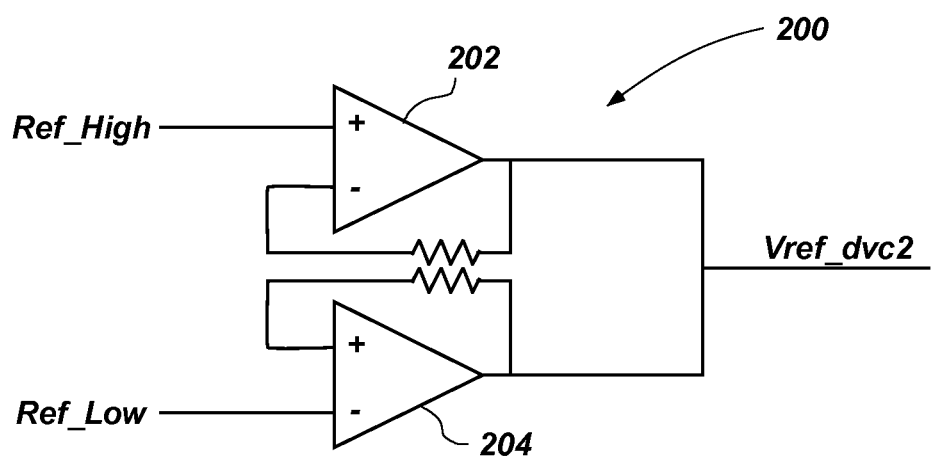
FIG. 2 is a schematic diagram of a conventional power generator.

Power generator 300 may include a feedback configuration (e.g., the configuration of power generator 200 illustrated in FIG. 2) to provide for regulation of a reference voltage DVC2 (which may also be referred to as bias voltage DVC2). Therefore, power generator 300 may be configured to receive upper reference voltage $V_{Ref\_high}$ and lower reference voltage $V_{Ref\_low}$. Furthermore, power generator 300 may be configured to output reference voltage DVC2 having a voltage less than or equal to upper reference voltage $V_{Ref\_high}$ and greater than or equal to lower reference voltage $V_{Ref\_low}$. It should be noted that although power generator 300 may be referred to herein as a DVC2 power generator, embodiments of the present invention may apply to any on-chip power generator. Furthermore, for explanation purposes only, and not by way of limitation, it is assumed throughout this description that during normal operation of memory device 504 (FIG. 3), with no rows active, the dead band of power generator 300 is equal to 50 mV.

According to one embodiment of the disclosure, signal generator 312 may comprise a temperature sensor configured to send one or more control signals to control device 310 indicating a temperature of memory device 504. Upon receipt of the one or more control signals, control device 310 may determine and output the appropriate magnitudes for upper reference voltage $V_{Ref\_high}$ and/or lower reference voltage $V_{Ref\_low}$. For example only, if the one or more control signals indicate that the temperature of memory device 504 is above or below a specified value, control device 310 may adjust upper reference voltage $V_{Ref\_high}$ and/or lower reference voltage $V_{Ref\_low}$ accordingly. More specifically, for example only, control device 310 may include control logic configured to increase upper reference voltage $V_{Ref\_high}$ by a specific amount if the temperature of memory device 504 is less than 60° C. or decrease lower reference voltage $V_{Ref\_low}$ by a specific amount if the temperature of memory device 504 is greater than 60° C.

As known by one having ordinary skill in the art, during low temperature operation, sensing a "0" on a memory cell may be challenging. Therefore, during low temperature operation, it may be advantageous to minimize the drift of reference voltage DVC2 in the decreasing direction. Conversely, as known by one having ordinary skill in the art, at low temperatures, a "1" on a memory cell does not have a tendency to leak and, therefore, allowing reference voltage DVC2 to drift in the increasing direction may not substantially affect the operation of memory device 504. Therefore, during low temperature operation, it may be beneficial to increase upper reference voltage $V_{Ref\_high}$ in order to decrease current consumption. Accordingly, if the one or more control signals indicate that memory device 504 is operating at low temperature, control device 310 may increase upper reference voltage $V_{Ref\_high}$. Consequently, this should reduce the current consumption of power generator 300 by increasing an upper limit of the dead band of power generator 300.

Similarly, as known by one having ordinary skill in the art, during high temperature operation, sensing of a "1" on a memory cell may be challenging due to the tendency of a "1" to leak at high temperatures. Therefore, during high temperature operation, it may be advantageous to minimize the drift of reference voltage DVC2 in the increasing direction. Conversely, as known by one having ordinary skill, at high temperatures, a "0" on a memory cell does not have a tendency to leak and, therefore, allowing reference voltage DVC2 to drift in the decreasing direction may not substantially affect the operation of memory device 504. Therefore, during high temperature operation, it may be beneficial to decrease lower reference voltage $V_{Ref\_low}$ in order to decrease current consumption. Accordingly, if the one or more control signals indicate that memory device 504 is operating at high temperature, control device 310 may decrease lower reference voltage $V_{Ref\_low}$. Consequently, this should reduce the current consumption of power generator 300 by decreasing a lower limit of the dead band of power generator 300.

According to another embodiment of the disclosure, control signal generator 312 may comprise a voltage sensor. In this embodiment, control signal generator 312 may send one or more control signals to control device 310 indicating a voltage on memory device 504 (e.g., an operating voltage or a reference voltage). Upon receipt of the one or more control signals, control device 310 may determine and output the appropriate magnitudes for upper reference voltage $V_{Ref\_high}$ and lower reference voltage $V_{Ref\_low}$. For example, if the one or more control signals indicate that the voltage of interest is above or below a specific magnitude, control device 310 may adjust upper reference voltage $V_{Ref\_high}$ and lower reference voltage $V_{Ref\_low}$ accordingly. More specifically, for example only, control device 310 may include control logic configured to decrease both upper reference voltage $V_{Ref\_high}$ and lower reference voltage $V_{Ref\_le}$, if the voltage of interest is below a specific voltage. Therefore, power generator system 302 may provide for adjustment of the dead band to a higher or lower range of operation.

In another embodiment of the disclosure, control signal generator 312 may comprise a state machine configured to send one or more control signals indicating the current operational mode of memory device 504 (e.g., self-refresh, data write, data read, or activate). Upon receipt of the one or more control signals, control device 310 may determine and output the appropriate magnitudes for upper reference voltage $V_{Ref\_high}$ and lower reference voltage $V_{Ref\_low}$. For example, during low power operation of memory device 504 (e.g., self-refresh), it may be advantageous to sacrifice accuracy of output reference voltage DVC2 for a reduction in the current consumption. In this example, control signal generator 312 may send one or more control signals to control device 310 indicating that memory device 504 is in a low power operation. Thereafter, control device 310 may decrease the voltage of lower reference voltage $V_{Ref\_low}$ and/or increase the voltage of upper reference voltage $V_{Ref\_high}$ accordingly. For example only, control device 310 may decrease lower reference voltage $V_{Ref\_low}$ by 25 mV and increase upper reference voltage $V_{Ref\_high}$ by 25 mV. Consequently, this should widen the dead band to 100 mV by increasing the upper limit of the dead band and lowering the lower limit of the dead band. As a result, the current consumption of power generator 300 should be decreased.

As another example, during a high power operation (e.g., "data read" or "data write") it may be advantageous to narrow the dead band of power generator 300 in order to increase the accuracy of output reference voltage DVC2. In this example, control signal generator 312 may send one or more control signals to control device 310 indicating that memory device 504 is in high power operation. Thereafter, control device 310 may increase the voltage of lower reference voltage $V_{Ref\_low}$ and/or decrease the voltage of upper reference voltage $V_{Ref\_high}$ accordingly. For example only, control device 310 may increase lower reference voltage $V_{Ref\_low}$ by 20 mV and decrease upper reference voltage $V_{Ref\_high}$ by 20 mV. Consequently, this should narrow the dead band to 10 mV by decreasing the upper limit of the dead band and increasing the lower limit of the dead band. As a result, tighter control of output reference voltage DVC2 should be achieved.

According to another embodiment of power generator system 302, control signal generator 312 may comprise a mode register. In this embodiment, memory controller 502 (see FIG. 3) may send a load mode command to control signal generator 312 indicating whether memory device 504 is operating in a high power state, requiring a narrow dead band, or a low power state, where a broad dead band may be sufficient. Control signal generator 312 may then send one or more control signals to control device 310 indicating the operational mode of memory device 504. Similar to the embodiment described above, wherein control signal generator 312 comprises a state machine, upon receipt of the one or more control signals control device 310 may determine and output the appropriate magnitudes for upper reference voltage $V_{Ref\_high}$ and lower reference voltage $V_{Ref\_low}$.

In yet another embodiment of the disclosure, an external device, such as memory controller 502, may send one or more control signals to control device 310 indicating the operational mode of memory device 504. Accordingly, in this embodiment, control signal generator 312, as illustrated in FIG. 4, may not be required (e.g., the memory controller would be considered the control signal generator). Upon receipt of the one or more control signals, control device 310 may determine and output the appropriate magnitudes for upper reference voltage $V_{Ref\_high}$ and lower reference voltage $V_{Ref\_low}$.

According to embodiments such as those described above, power generator system 302 may be configured to operate at a variable dead band depending on the operational status of memory device 504. Therefore, power generator system 302 may provide for tight control of reference voltage DVC2 when necessary, and may enable current savings during operations wherein tight control of reference voltage DVC2 is unnecessary.

Figure 5:
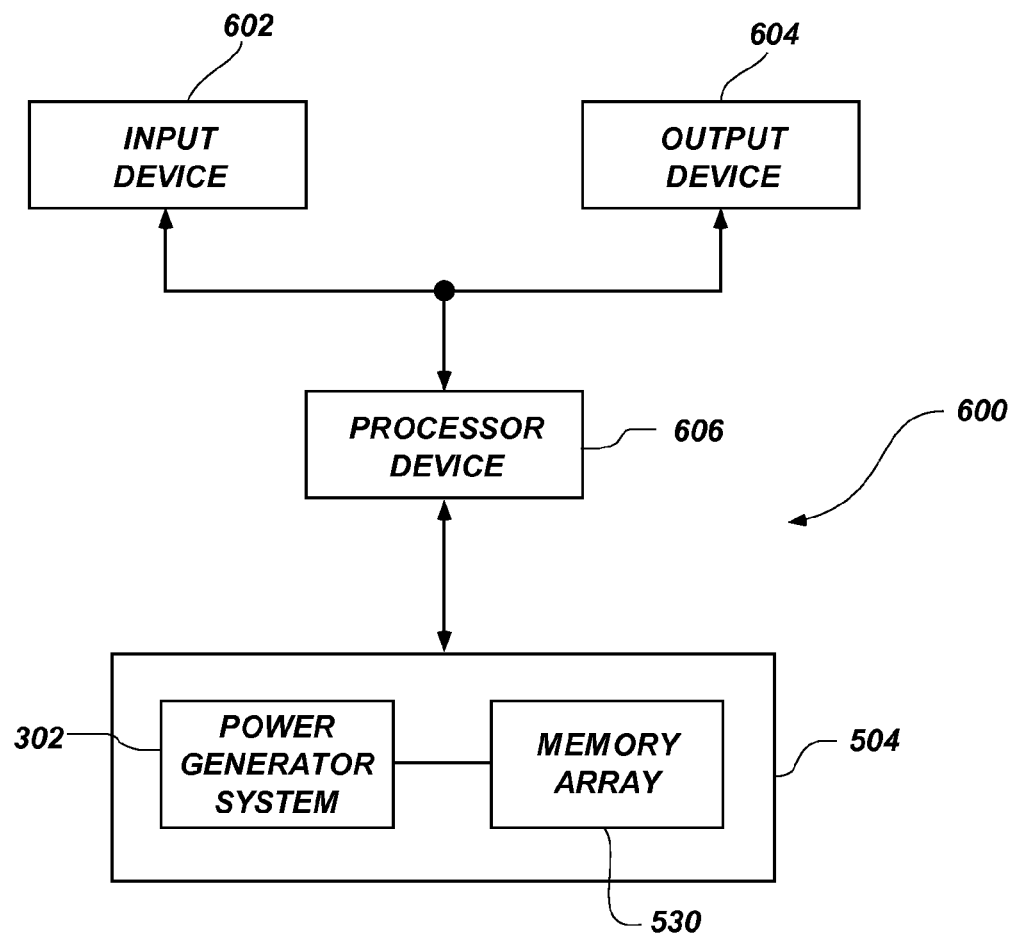
FIG. 5 is a block diagram of an electronic system including a memory device further including a power generator system, in accordance with an embodiment of the present invention.

FIG. 5 is a block diagram of an electronic system 600 including a memory device, in accordance with a further embodiment of the present invention. Electronic system 600 includes an input device 602, an output device 604, and a memory device 504, all coupled to a processor device 606. The memory device 504 incorporates at least one power generator system 302 of one or more of the preceding embodiments of the present invention. Electronic system 600 may include, by way of example only, cell phones, personal digital assistants (PDAs), computers, and other similar electronic devices.

Specific embodiments have been shown by way of non-limiting examples in the drawings and have been described in detail herein; however, the various embodiments may be susceptible to various modifications and alternative forms. It should be understood that the invention is not limited to the particular forms disclosed. Rather, the invention encompasses all modifications, equivalents, and alternatives falling within the scope of the following appended claims and their legal equivalents.

What is claimed is:

1. A system, comprising:
    a control device configured to output and to independently adjust a first magnitude of a first reference voltage and a second magnitude of a second reference voltage; and
    a power generator operably coupled to the control device, the power generator configured to receive the first reference voltage and the second reference voltage and to compare an output voltage with each of the first reference voltage and the second reference voltage to define an adjustable dead band range for the output voltage, wherein the output voltage is greater than or substantially equal to the first magnitude of the first reference voltage and less than or substantially equal to the second magnitude second reference voltage.

2. The system of claim 1, further comprising at least one signal generator operably coupled to the control device and adapted to provide at least one control signal thereto, wherein the control device is configured to independently adjust at least one of the first magnitude of the first reference voltage and the second magnitude of the second reference voltage in response to the control signal.

3. The system of claim 2, wherein the at least one signal generator comprises at least one of a temperature sensor, a voltage sensor, a state machine, and a mode register.

4. The system of claim 1, wherein the first magnitude of the first reference voltage is relatively lower than the second magnitude of the second reference voltage such that the first reference voltage defines a lower voltage limit of the adjustable dead band range and the second magnitude of the second reference voltage defines an upper voltage limit of the adjustable dead band range.

5. The system of claim 1, wherein the control device is configured to receive at least one control signal from an external device.

6. The system of claim 1, wherein the power generator comprises:
    a first operational amplifier having the first reference voltage and the output voltage as inputs; and
    a second operational amplifier having the second reference voltage and the output voltage as inputs.

7. A system within a semiconductor device configured to produce a variable dead band voltage range of an output voltage, the variable dead band voltage range defined by an upper reference voltage and a lower reference when each of the upper reference voltage and the lower reference voltage are compared with the output voltage, wherein each of the upper reference voltage and the lower reference voltage is independently adjustable.

8. The system of claim 7, wherein the voltage range of the variable dead band voltage range is greater than or substantially equal to 5 mV and less than or substantially equal to 200 mV.

9. The system of claim 7, wherein the semiconductor device is further configured to adjust the variable dead band range at least partially in response to at least one control signal.

10. A method of operating a power generator system, comprising:
    receiving a first reference voltage and a second reference voltage at a power generator, the first reference voltage having a first magnitude and the second reference voltage having a second magnitude;
    generating an output voltage at the power generator;
    comparing a feedback path of the output voltage with each of the first reference voltage and the second reference voltage to maintain the output voltage within a dead band range having limits defined approximately by the first magnitude of the first reference voltage and the second magnitude of the second reference voltage;
    receiving a control signal;

adjusting at least one of the first magnitude of the first reference voltage and the second magnitude of the second reference voltage in response to the control signal, wherein the magnitudes of each of the first reference voltage and the second reference voltage are independently adjustable.

11. The method of claim 10, wherein adjusting at least one of the first magnitude of the first reference voltage and the second magnitude of the second reference voltage comprises at least one of increasing the first magnitude of the first reference voltage and decreasing the second magnitude of the second reference voltage during a high power operation.

12. The method of claim 10, wherein adjusting at least one of the first magnitude of the first reference voltage and the second magnitude of the second reference voltage comprises at least one of decreasing the first magnitude of the first reference voltage and increasing the second magnitude of the second reference voltage during a low power operation.

13. The method of claim 10, wherein adjusting at least one of the first magnitude of the first reference voltage and the second magnitude of the second reference voltage comprises decreasing the first magnitude of the first reference voltage during a high temperature operation.

14. The method of claim 10, wherein adjusting at least one of the first magnitude of the first reference voltage and the second magnitude of the second reference voltage comprises increasing the second magnitude of the second reference voltage during a low temperature operation.

15. A memory system, comprising:
a control device adapted to output at least one of a plurality of independently adjustable reference voltages; and
a power generator operably coupled to the control device and adapted to output a bias voltage having a feedback path that is compared with each of the independently adjustable reference voltages of the plurality such that the bias voltage is within an adjustable dead band range having limits that are approximately equal to magnitudes of the plurality of independently adjustable reference voltages.

16. The system of claim 15, further comprising a control signal generator operably coupled with the control device, wherein the control signal generator is selected from the group consisting of a temperature sensor, a voltage sensor, a state machine, a mode register, and a memory controller, the control signal generator adapted to provide a command to the control device to adjust at least one of the magnitudes of the plurality of independently adjustable reference voltages.

17. An electronic system, comprising:
at least one processor;
at least one memory device; and
at least one power generator system operably associated with the at least one memory device comprising:
a control device configured to output a lower reference voltage having a first magnitude and an upper reference voltage having a second magnitude, wherein the first magnitude of the lower reference voltage is relatively lower than the second magnitude of the upper reference voltage, wherein the control device is configured to independently adjust the first magnitude of the lower reference voltage and the second magnitude of the upper reference voltage in response to at least one control signal; and
a power generator operably coupled to the at least one control device and configured to output a bias voltage having a feedback path that is compared with each of the lower reference voltage and the upper reference voltage such that the bias voltage has an adjustable dead band range that is greater than or substantially equal to the lower reference voltage and less than or substantially equal to the upper reference voltage.

18. The electronic system of claim 17, further comprising a signal generator and a memory controller operably coupled to the at least one control device and configured to generate the at least one control signal.

19. The electronic system of claim 17, wherein the at least one memory device comprises at least one of a Flash memory device, a DRAM device, and a SRAM device.

20. The electronic system of claim 17, wherein a voltage range of the adjustable dead band range is greater than or substantially equal to 5 mV and less than or substantially equal to 200 mV.

* * * * *

UNITED STATES PATENT AND TRADEMARK OFFICE
CERTIFICATE OF CORRECTION

PATENT NO. : 8,427,887 B2
APPLICATION NO. : 13/224070
DATED : April 23, 2013
INVENTOR(S) : George F. G. Carey et al.

It is certified that error appears in the above-identified patent and that said Letters Patent is hereby corrected as shown below:

In the Claims:

In column 8, line 10, in Claim 1, after "second magnitude" insert -- of the --.

In column 8, line 41, in Claim 7, after "lower reference" insert -- voltage, --.

Signed and Sealed this
Twenty-fifth Day of June, 2013

Teresa Stanek Rea
*Acting Director of the United States Patent and Trademark Office*